United States Patent
Kaminishi

[19]

[11] Patent Number: 6,037,832
[45] Date of Patent: Mar. 14, 2000

[54] TEMPERATURE DEPENDENT CONSTANT-CURRENT GENERATING CIRCUIT AND LIGHT EMITTING SEMICONDUCTOR ELEMENT DRIVING CIRCUIT USING THE SAME

[75] Inventor: Katsuji Kaminishi, Yokohama, Japan

[73] Assignee: Kabushiki Kaisha Toshiba, Kawasaki, Japan

[21] Appl. No.: 09/126,779

[22] Filed: Jul. 31, 1998

[30] Foreign Application Priority Data

Jul. 31, 1997 [JP] Japan ................................. 9-206814
Feb. 24, 1998 [JP] Japan ................................. 10-042109

[51] Int. Cl.[7] ................................................... G05F 1/10
[52] U.S. Cl. ....................... 327/538; 327/513; 323/315; 323/312
[58] Field of Search ................................. 327/530, 512, 327/513, 538, 539; 232/312, 315, 316

[56] References Cited

U.S. PATENT DOCUMENTS

| | | | |
|---|---|---|---|
| 5,223,743 | 6/1993 | Nakagawara | 323/316 |
| 5,629,611 | 5/1997 | McIntrye | 323/316 |
| 5,751,142 | 5/1998 | Dosho et al. | 327/316 |
| 5,801,582 | 9/1998 | Weber | 323/312 |

FOREIGN PATENT DOCUMENTS 3-214935 9/1991 Japan .
8-139410 5/1996 Japan .

*Primary Examiner*—Jung Ho Kim
*Attorney, Agent, or Firm*—Oblon, Spivak, McClelland, Maier & Neustadt, P.C.

[57] ABSTRACT

A temperature dependent constant-current generating circuit includes a reference voltage generating circuit for generating a stable reference voltage against the power supply voltage and a temperature change, a stabilized voltage generating circuit for generating a stabilized voltage based on the reference voltage, a voltage divider for dividing the reference voltage, a common-emitter amplifier for amplifying an output voltage from the voltage divider, a current mirror circuit for outputting a current in a direction opposite to an output current from the amplifier, a current-to-voltage conversion resistor connected between the output terminal of the stabilized voltage generating circuit and the output terminal of the current mirror circuit, a buffer amplifier for receiving a voltage generated at the current input terminal of the resistor, and a current feedback output-stage amplifier driven by an output from the buffer amplifier. The constant-current generating circuit can generate a DC bias current which faithfully follows temperature variations in threshold current of an LD and has a high temperature compensation characteristic precision, and is a small-size, low-cost circuit and can be used in an LD driving circuit for fiber-optic subscriber systems including FTTH and optical links.

7 Claims, 5 Drawing Sheets

TEMPERATURE DEPENDENT CONSTANT-CURRENT GENERATING CIRCUIT AND LIGHT EMITTING SEMICONDUCTOR ELEMENT DRIVING CIRCUIT USING THE SAME

BACKGROUND OF THE INVENTION

The present invention relates to a constant-current generating circuit and, more particularly to a temperature dependent constant-current generating circuit suitable for a feed forward controlled laser driving circuit for maintaining constant light emission characteristics and/or small time jitter characteristics of an optical output device, such as an optical transmitter or optical links, using a semiconductor light emitting element as a light source, and a driving circuit for driving a semiconductor light emitting element, such as a semiconductor laser diode, using the same.

In recent years, optical telecommunication and optical data links have rapidly been spread. In an optical transmitter used for these purposes, a semiconductor laser (laser diode: LD) directly generates an intensity-modulated light signal. The light signal is transmitted via an optical transmission medium such as an optical fiber.

Particularly, fiber-optic subscriber systems such as FTTH (Fiber To The Home) designed for home optical telecommunication, and transmission modules used for optical data links employ, as an intensity modulation method, a driving method of keeping a high ON/OFF intensity ratio of the light signal (extinction ratio) by supplying a DC biased pulse current to the LD. The DC bias current flowing through the LD should keep slightly lower than the threshold current in the light OFF state, and the pulse amplitude is large enough to oscillate the laser in the light ON state, and to obtain a necessary output intensity.

When a transmission signal speed is relatively low, the systems and the modules may use a zero bias driving method of completely nullifying the bias current in the OFF state of the LD. However, as the frequency of the transmission signal increases, the zero bias driving method becomes difficult to directly apply due to the following reason.

Letting $\tau$ be the carrier life time of an LD in use, Ith be the threshold current of the LD, Ib be the DC bias current flowing through the LD, and Ip be the pulse current amplitude to get the required transmission signal, the laser oscillation delay time Td of the LD is given by $$Td = \tau \times \ln(Ip/(Ip+Ib-Ith)). \qquad (1)$$

In general, $\tau$· is on the nsec order. For a signal transmission rate of 100 Mb/s or more, a parentheses value of the logarithmic term of equation (1) must be suppressed to 0.1 or less. To realize this in a case of the zero bias state (Ib=0), the ratio Ip/Ith must be 0.1 or less, in other words, the value Ip must be 10 times larger than the value Ith or more. The pulse current amplitude Ip is inevitably set much larger than a value enough to obtain a necessary laser intensity. As a result, the driving circuit must be required a high power, and the power consumption increases.

To the contrary, a pseudo zero bias driving method of always flowing, through the LD, a DC bias current Ib slightly smaller than the threshold current Ith is more advantageous because a high ratio Ip/(Ith–Ib) can be easily attained even if the pulse current amplitude Ip is not so large compared with the zero bias driving method. Therefore, the use of the pseudo zero bias driving method can easily achieve shortening the laser oscillation delay time of the LD, ensuring a high frequency operation, and obtaining a high extinction ratio.

Even in the pseudo zero bias driving method, however, the DC bias current Ib may be difficult to control. Letting T0 be the characteristic temperature of a specified laser threshold current in use, and Is be the threshold current at a temperature T=Ts (standard temperature), the threshold current Ith at an arbitrary temperature T is given by $$Ith = Is \times \exp((T-Ts)/T0). \qquad (2)$$

The threshold current Ith nonlinearly responses upon a temperature change. For example, in an InP-based LD, the characteristic temperature T0 is several tens to a hundred, and thus the threshold current Ith exhibits a change several to 10 times for a temperature change of 100° C. To make the DC bias current Ib to follow just below the threshold current Ith and keep the difference between these currents almost constant in order to realize pseudo zero bias driving of the LD, the DC bias current generating circuit itself must be the same dependency on temperatures as in the threshold current Ith.

However, no prior art realizes a simple DC bias current generating circuit which can accurately follow temperature variations in threshold current Ith and can be applied to LDs having various characteristic temperatures. For example, a conventional temperature compensation method for the threshold bias current of the LD includes a method of checking the differential value of the DC bias current, and searching and fixing the inflection point near the threshold current, and a method of monitoring the actual light emission intensity of the LD and feeding it back to the DC bias current. These methods require a large scale detection/feedback circuit, so they cannot be applied to purposes in which ICs must be compact, such as LD driving circuits for fiber-optic subscriber systems including FTTH and optical links.

In the LD, not only the threshold current Ith but also the light emission intensity has temperature characteristics. It is known that the light emission intensity can be expressed by an exponential function which decreases together with the temperature using a characteristic temperature T0' as a constant. The characteristic temperature T0' representing the temperature dependency of the light emission intensity of the LD is as high as about several hundred, unlike the characteristic temperature T0 representing the temperature dependency of the threshold current. For this reason, the light emission intensity does not greatly depend upon a temperature change, compared with the threshold current, but often requires temperature degradation compensation. Conventional optical telecommunication has used an APC (Automatic Power Control) circuit for keeping the light emission intensity of the LD constant in order to suppress degradation of the signal quality by the uniform magnitudes of optical transmission signals. A large scale APC circuit of monitoring a part of the LD output with a PD (PhotoDetector) and feeding it back activity to the LD for the purpose of strict control is popularly required.

Since recent improvements of LD performances result in uniform and stable physical characteristics, the characteristic temperature of the LDs is regarded almost constant between elements of a specified product, and a feed forward stabilization circuit is being used. That is, to easily compensate the light emission intensity degradation of the LD by a temperature change, the light emission intensity of the LD is controlled by increasing LD driving current generated by a current source with characteristic temperature. T0'. Thereby the lowering of efficiency of the light emission of the LD is compensated under this passive feed-forward-control.

As the temperature compensation method for the light emission intensity of the LD in the feed forward APC circuit, Jpn. Pat. Appln. KOKAI Publication Nos. 3-214935 and 8-139410, and the like have disclosed that the characteristics of the LD are grasped in advance, and (a) the light emission intensity is roughly approximated using the temperature dependency of the Si diode in the IC; (b) the approximation precision is increased by selecting an appropriate thermistor; (c) the light emission intensity is approximated using a polygonal line by switching several different resistors; or (d) the characteristics of the LD are stored in a memory, and the light emission intensity is strictly adjusted using a D/A converter. Jpn. Pat. Appln. KOKAI Publication No. 9-270507 has disclosed a combination of a voltage source as a modification of a bandgap reference voltage source, an emitter follower, and a current feedback amplifier.

In any of these methods, however, compensation characteristics against a temperature change are inaccurate, and the temperature range is limited. The number of adjustment portions of the circuit is large to adjust characteristics, and adjustment itself is cumbersome. Some of these methods which pose a smaller number of problems require a complicated and large scale control circuit to increase a chip size, or cannot be flexibly applied to LDs having slightly different characteristic temperatures except for specific LDs.

Recently, along with higher performance of multimedia equipments, demands arise for a low power consumption of optical interconnects capable of passing a high speed signal having a frequency of 100 Mb/s or more, instead of a twisted pair cable and a coaxial cable. To meet demands for lower power consumption on the system side, the power supply voltage in use must be low in the driving circuit for driving a light emitting semiconductor element such as a semiconductor laser diode used in an optical interconnect.

In the driving circuit for driving a light emitting semiconductor element, as the power supply voltage decreases, the operation margin of the internal circuit decreases, and the operation margin of the application voltage to the light emitting semiconductor element decreases. Particularly in a differential current switching circuit generally used on the output stage of the driving circuit, the emitter voltage of the transistor constituting the switching circuit rises in a high-temperature operation range in addition to temperature variations in emitter follower circuit on the pre-driver input stage of the switching circuit on the output stage. If the voltage between the collector and emitter necessary for a high frequency operation is kept constant, the application voltage to the load inevitably decreases by an increase in the emitter voltage, resulting in a small operation margin of the light emitting semiconductor element.

Further, in light emitting semiconductor elements such as a semiconductor laser diode and a light emitting diode, as the temperature rises, the light emission efficiency decreases, the current to be injected to the element increases, and the voltage to be applied increases.

Accordingly, the conventional driving circuit cannot meet demands for a decrease in power supply voltage.

As described above, the circuit for generating a DC bias current capable of faithfully following temperature variations in threshold current of the semiconductor laser diode which exponentially changes with temperature is required in the pseudo zero bias driving method of always flowing a DC bias current slightly smaller than the threshold current through a semiconductor laser diode in order to shorten the oscillation delay time, ensure a high frequency operation, and obtain a high extinction ratio so as to realize a high-speed optical data link with a small error rate of transmission. It is, however, difficult to realize this DC bias current generating circuit by the conventional technique. Temperature compensation characteristics can be applied to only a semiconductor laser diode having specific characteristics. The DC bias current generating circuit requires a large scale detection/feedback circuit, resulting in a high cost. At the same time, it is essentially difficult to downsize the DC bias current generating circuit.

In the conventional technique, various methods of temperature-compensating the light emission intensity of a semiconductor laser diode in the feed forward APC circuit have been proposed. In any of these methods, however, compensation characteristics against a temperature change are inaccurate, and the temperature range is limited. The number of adjustment portions is large to adjust characteristics, and adjustment itself is cumbersome. A complicated circuit is required to increase the chip size. In addition, some methods cannot be applied to semiconductor laser diodes having different characteristic temperatures except for semiconductor laser diodes having specific characteristics.

In the conventional driving circuit for driving a light emitting semiconductor element such as a semiconductor laser diode at a very high frequency, as the power supply voltage decreases particularly in a high-temperature operation range, the operation margin of the internal circuit decreases, and the operation margin of the application voltage to the light emitting semiconductor element decreases. When the light emission efficiency decreases, the current to be injected to the element increases, and the voltage to be applied increases. The driving circuit cannot meet demands for a decrease in power supply voltage.

BRIEF SUMMARY OF THE INVENTION

Accordingly, it is an object of the present invention to provide a temperature dependent constant-current generating circuit which can generate a DC bias current excellent in temperature compensation characteristic precision that faithfully follows temperature variations in threshold current of a semiconductor laser, can be widely applied to semiconductor laser driving circuits for fiber-optic subscriber systems such as FTTH or optical links because of a small chip size and a low cost, and can also be applied to temperature compensation for the output intensity of the semiconductor laser diode.

It is another object of the present invention to provide a temperature dependent constant-current generating circuit which can be widely applied, has adjustable characteristics in correspondence with a wide characteristic temperature range of a semiconductor laser diode, and can be applied to a driving circuit array for multichannel optical links or multi-output FTTH optical transmission modules.

It is still another object of the present invention to provide a driving circuit which can stably drive an light emitting semiconductor element such as a semiconductor laser diode by using the temperature dependent constant-current generating circuit with a low-voltage power supply even in a high-temperature operation range, and can meet demands for a decrease in power supply voltage.

According to one aspect of the present invention, there is provided a temperature dependent constant-current generating circuit comprising: a stabilized voltage generating circuit for generating a stabilized voltage using a predetermined reference voltage; a voltage divider for dividing the reference voltage; a current amplifier including a transistor having a base or gate connected to a divided-voltage output terminal of the voltage divider and a grounded emitter or source; a current mirror circuit for outputting a current in a direction opposite to a current output from the current amplifier; a current-to-voltage conversion resistor having one terminal connected to an output terminal of the stabilized voltage generating circuit and the other terminal connected to an output terminal of the current mirror circuit; and an output-stage amplifier constituted by a transistor having a base or gate for receiving a voltage generated at the other terminal of the current-to-voltage conversion resistor, and a current feedback resistor connected to an emitter or source of the transistor, the transistor having a collector or drain connected to a load.

According to another aspect of the present invention, there is provided a temperature dependent constant-current generating circuit comprising: a stabilized voltage generating circuit for generating a stabilized voltage using a predetermined reference voltage; a voltage divider for dividing the reference voltage; a current amplifier including a transistor having a base or gate connected to a divided-voltage output terminal of the voltage divider and a grounded emitter or source; a current-to-voltage conversion resistor having one terminal connected to an output terminal of the stabilized voltage generating circuit and the other terminal connected to an output terminal of the current amplifier; and an output-stage amplifier constituted by a transistor having a base or gate for receiving a voltage generated at the other terminal of the current-to-voltage conversion resistor, and a current feedback resistor connected to an emitter or source of the transistor, the transistor having a collector or drain connected to a load.

According to still another aspect of the present invention, there is provided a light emitting semiconductor element driving circuit comprising: a temperature dependent constant-current generating circuit connected to a light emitting semiconductor element as a load; a limit differential amplifier for amplifying a differential input signal; a pair of intermediate amplifiers including a pair of transistors which receive two outputs from the limit differential amplifier and each of which has a grounded collector or drain; and a current switching circuit constituted by a pair of transistors each having a base or gate for receiving an output from the pair of intermediate amplifiers and a collector or drain connected to the light emitting semiconductor element.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention in which.

DETAILED DESCRIPTION OF THE INVENTION

Figure 1:
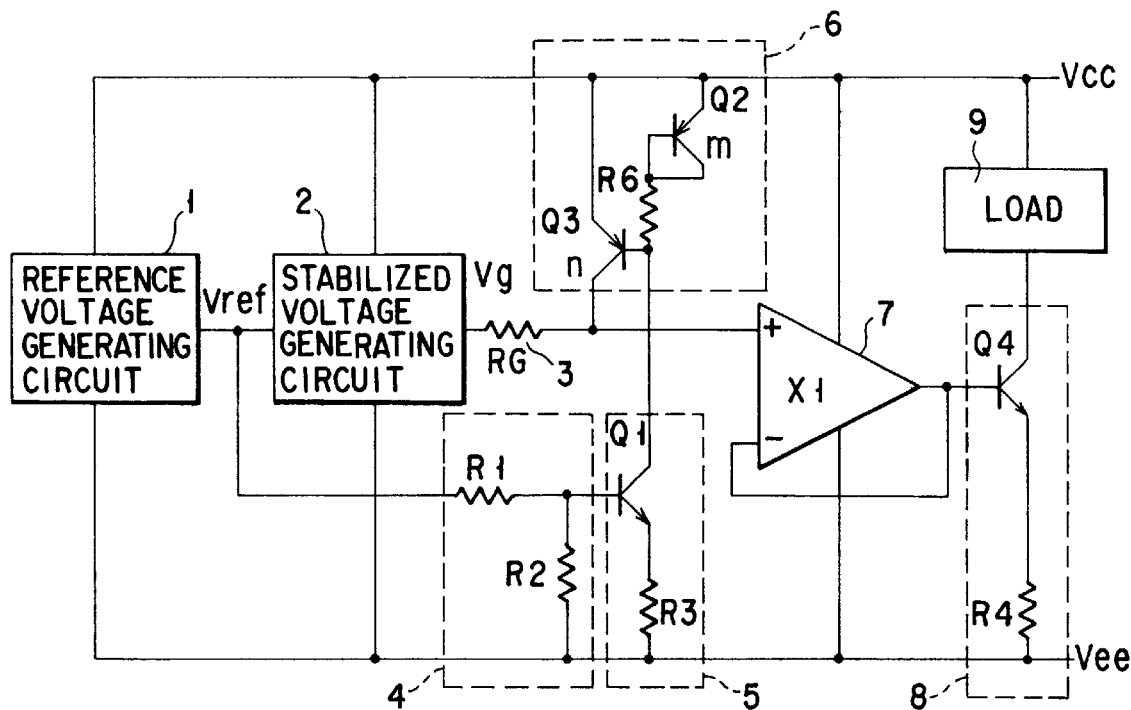
FIG. 1 is a circuit diagram showing a temperature dependent constant-current generating circuit according to the first embodiment of the present invention.

For easier understanding of the present invention, the fundamental concept will be described briefly prior to the detailed description of the embodiments.

A temperature dependent constant-current generating circuit according to the present invention comprises a stabilized voltage generating circuit for generating a stabilized voltage using a predetermined reference voltage, a voltage divider for dividing the reference voltage, a current amplifier including a transistor having a base or gate connected to a divided-voltage output terminal of the voltage divider and a grounded emitter or source, a current mirror circuit for outputting a current in a direction opposite to a current output from the current amplifier, a current-to-voltage conversion resistor having one terminal connected to an output terminal of the stabilized voltage generating circuit and the other terminal connected to an output terminal of the current mirror circuit, and an output-stage amplifier constituted by a transistor having a base or gate for receiving a voltage generated at the other terminal of the current-to-voltage conversion resistor, and a current feedback resistor connected to an emitter or source of the transistor, the transistor having a collector or drain connected to a load.

This temperature dependent constant-current generating circuit may further comprise a buffer amplifier inserted between the other terminal of the current-to-voltage conversion resistor and the base or gate in the output-stage amplifier.

The reference voltage is kept constant upon variations in power supply voltage and operation temperature. The voltage by the stabilized voltage generating circuit is set at a value larger than the reference voltage, slightly smaller than a voltage which allows the constant-current generating circuit to generate a desired output current at a reference temperature, and smaller by the voltage between terminals generated by a current flowing into the current-to-voltage conversion resistor at the reference temperature.

The temperature independent stabilized voltage from the stabilized voltage generating circuit is applied to one terminal of the current-to-voltage conversion resistor. Then, a voltage as the sum of the stabilized voltage and the temperature dependent voltage prepared by converting an output current from the current mirror circuit generates at the other terminal. In the current amplifier, a voltage obtained by dividing the reference voltage by the voltage divider is applied to the base or gate of the transistor to flow a current pseudo-exponentially changing depending on the temperature as an output current from the current amplifier through the collector or drain of the transistor. The current mirror circuit outputs a current pseudo-exponentially changing depending on the temperature in a direction opposite to the output current from the current amplifier. The output current flows into the other terminal of the current-to-voltage conversion resistor.

At the reference temperature, the reference voltage generating circuit generates a desired output current at the current input terminal of the current-to-voltage conversion resistor for the current mirror circuit. At temperatures other than the reference temperature, a voltage pseudo-exponentially changing in accordance with the temperature is generated. The voltage generated at the current input terminal of the current-to-voltage conversion resistor is applied to the base or gate of the output transistor in the output-stage amplifier via the buffer amplifier. From the collector or drain of the output transistor, a temperature-compensated output current which has a desired value at the reference temperature and pseudo-exponentially changes in accordance with the temperature is supplied to the load. In this case, the voltage generated at the current input terminal of the current-to-voltage conversion resistor is input to the output-stage amplifier after its impedance is decreased by the buffer amplifier, i.e., the amplifier having a gain of 1. With this processing, the input voltage to the output-stage amplifier can be prevented from being influenced by variations in load.

The temperature dependent constant-current generating circuit of the present invention can generate an output current which has a desired current value at the reference temperature and pseudo-exponentially changes upon a temperature change. When this constant-current generating circuit is applied to an LD driving circuit, the constant-current generating circuit can generate, with a high precision, a DC bias current which always follows temperature variations in threshold current of the LD and is slightly smaller than the threshold current. The DC bias current flows through the LD to realize pseudo zero bias driving, which is difficult to perform in a conventional circuit. In this case, a component dependent on the temperature of an output current, and an offset component independent of the temperature can be individually set by appropriately selecting the relationship between the stabilized voltage generated by the stabilized voltage generating circuit and the voltage generated across the current-to-voltage conversion resistor.

The voltage division ratio of the voltage divider depends on the absolute value of the reference voltage, the characteristics of the current amplifier (e.g., the voltage between the base and emitter of the transistor), the resistance value of the current-to-voltage conversion resistor, and the temperature dependency (characteristic temperature) of an output current from the constant-current generating circuit. Since these values, except for the characteristic temperature, can be designed as fixed values, the temperature dependency (characteristic temperature) of the output current can be changed by changing the voltage division ratio of the voltage divider. Also, the temperature dependency (characteristic temperature) of the output current can also be adjusted by adjusting the value of the current-to-voltage conversion resistor.

The current mirror circuit is given a current amplification function by setting the size of an input-side transistor constituting the current mirror circuit larger than that of an output-side transistor. Even when an output current from the current amplifier is relatively small, a desired operation can be realized.

The current mirror circuit may be omitted from the temperature dependent constant-current generating circuit according to the present invention. Instead, a current amplifier including a transistor having a base or gate connected to the divided-voltage output terminal of the voltage divider, and a grounded emitter or source is arranged as a current discharge circuit. The output terminal of the current discharge type current amplifier may be connected to the other terminal of the current-to-voltage conversion resistor.

In the present invention, an amplifier (emitter follower circuit for a bipolar transistor) having a grounded collector or drain may be inserted between the output terminal of the buffer amplifier and the base or gate of the transistor of the output-stage amplifier. With this arrangement, a larger output current can be obtained by the current amplification function of the added amplifier, while the stability of the output-stage amplifier is maintained.

When circuits subsequent to the amplifier inserted between the buffer amplifier and the output-stage amplifier are arranged in a multi-stage structure, an array output type constant-current generating circuit can be realized. In this case, the added amplifier also functions to isolate the channels of array outputs.

A light emitting semiconductor element driving circuit according to the present invention comprises a light emitting semiconductor element as a load connected to the above-described temperature dependent constant-current generating circuit, a limit differential amplifier for amplifying a differential input signal, a pair of intermediate amplifiers including a pair of transistors which receive two outputs from the limit differential amplifier and each of which has a grounded collector or drain, and a current switching circuit constituted by a pair of transistors each having a base or gate for receiving an output from the pair of intermediate amplifiers and a collector or drain connected to the light emitting semiconductor element.

The limit differential amplifier desirably comprises a pair of differential transistors having a commonly connected emitter or source, a constant-current source connected to an emitter or source common connection point between the pair of differential transistors, two load resistors each having one terminal connected to a collector or drain of corresponding one of the pair of differential transistors, and a level shift resistor connected between the load resistors and a power supply.

When the transistor is a bipolar transistor in the driving circuit having this arrangement, temperature variations cause the emitter voltage of the transistor of the current switching circuit on the final stage to generate variations corresponding to temperature variations in two equivalent diodes which are the sum of the voltages between the base and emitter of the transistors of the emitter follower circuits constituting the intermediate amplifiers and the transistor of the current switching circuit. The generated temperature variations are canceled as follows.

More specifically, according to the first aspect, the temperature dependent constant-current source is connected to the connection point between the level shift resistor and the load resistor in the limit differential amplifier. This temperature dependent constant-current source may be controlled by the above-described temperature dependent constant-current generating circuit. A current from the temperature dependent constant-current source generates, at the level shift resistor, a voltage having a positive temperature coefficient enough to cancel the temperature coefficients of a half of two equivalent diodes. Accordingly, the emitter potential of the transistor of the current switching circuit is kept constant upon temperature variations. Even if the transistor ensures at least the voltage between the collector and emitter necessary for a high-speed operation, the application voltage to the light emitting semiconductor element as a load remains unchanged. The operation margin of the load does not decrease even upon a temperature rise. In a conventional driving circuit, large margins are distributed to internal circuits in consideration of various external variations. However, according to the present invention, the bias can be set low in consideration of only variations in power supply voltage. By transferring all extra margins to the load, the operation margin of the load further increases.

According to the second aspect, the constant-current source connected to the emitter or source common connection point between a pair of differential transistors depends on the temperature. This temperature dependent constant-current source may be controlled by the above-described temperature dependent constant-current generating circuit. According to the third aspect, the level shift resistor is a temperature-sensitive resistive element having a positive temperature coefficient whose resistance value is set to cause the same temperature coefficient of a voltage drop as a half of two equivalent diodes. By the second and third aspects, the same effects as those of the first aspect can be obtained.

According to the light emitting semiconductor element driving circuit of the present invention, the light emitting semiconductor element can be stably driven with a low-voltage power supply. Therefore, the power supply voltage can be decreased.

Embodiments of the present invention will be described below with reference to the several views of the accompanying drawing.

[First Embodiment]

FIG. 1 is a circuit diagram showing a temperature dependent constant-current generating circuit constituted by a bipolar transistor according to the first embodiment of the present invention.

A reference voltage generating circuit 1 generates, using a power supply voltage or a ground potential as a reference potential, a constant reference voltage Vref which is higher than the forward dropped voltage between the base and emitter of a bipolar transistor (to be simply referred to as the voltage between the base and emitter hereinafter), and is not influenced by changes in power supply voltage and operation temperature.

An example of the reference voltage generating circuit 1 is a basic bandgap voltage reference source, and a more desirable example is a circuit whose stability upon variations in power supply is enhanced (Japanese Patent Application No. 9-73985, or U.S. patent application Ser. No. 08/828,778: to be described later). An example of the reference voltage generating circuit 1 using a silicon bipolar transistor generates a stable voltage of about 1.2 V using a ground potential as a reference point, and outputs a voltage much higher than the voltage between the base and emitter of an npn transistor.

The reference voltage Vref generated by the reference voltage generating circuit 1 is applied to a stabilized voltage generating circuit 2 and a voltage divider 4. The stabilized voltage generating circuit 2 has an output terminal connected to one terminal of a current-to-voltage conversion resistor 3. The stabilized voltage generating circuit 2 generates a stabilized voltage Vg which has the same stability as that of the reference voltage Vref and is higher than it.

The stabilized voltage Vg is set at a value slightly smaller than a voltage which allows the constant-current generating circuit to output a desired current Is at a standard temperature Ts, e.g., at a value smaller by the voltage between terminals generated by a current flowing into the current-to-voltage conversion resistor 3 at the standard temperature. With this setting, an output current from the constant-current generating circuit can be divided into a temperature dependent component and a temperature independent offset component.

A voltage generated at the other terminal of the current-to-voltage conversion resistor 3 is finally converted into a current via a buffer amplifier 7 and an output-stage amplifier 8 (to be described later). The current is supplied to a load 9. The current flowing through the current-to-voltage conversion resistor 3 must compensate for temperature changes in voltage generated in the resistor 3, and thus must nonlinearly change in accordance with the characteristic temperature.

To realize this, according to the first embodiment, the reference voltage Vref generated by the reference voltage generating circuit 1 is divided by the voltage divider 4 constituted by resistors R1 and R2 series-connected between the output terminal of the reference voltage generating circuit 1 and a low-potential-side power supply Vee (e.g., ground). The divided-voltage output terminal (connection point between the resistors R1 and R2) of the voltage divider is connected to the base of an npn transistor Q1. The transistor Q1 and a resistor R3 connected to its emitter constitute a current feedback common-emitter amplifier 5. From the collector of the transistor Q1, a current which pseudo-exponentially changes upon a temperature change is output.

The voltage division ratio R2/(R1+R2) of the voltage divider 4 depends on the absolute value of the reference voltage Vref, the voltage between the base and emitter of the transistor Q1, a resistance value RG of the current-to-voltage conversion resistor 3, and a characteristic temperature T0 defining the temperature dependency of an output current finally supplied to the load 9. In practice, these values, except for the characteristic temperature T0, can be designed as fixed values. By appropriately adjusting the voltage division ratio, the characteristic temperature T0 can be arbitrarily adjusted.

More specifically, when the reference voltage Vref and the value RG of the current-to-voltage conversion resistor 3 are determined, the temperature dependency (characteristic temperature T0) of the output current supplied to the load 9 can be changed by changing the voltage division ratio of the voltage divider 4. When the characteristics of the load 9 are accurately measured, the voltage division ratio is optimized to approximate, with a high precision, current output characteristics which pseudo-exponentially change in accordance with the temperature within the entire operation temperature range. Note that the values of the resistors R1 and R2 are set to flow a bias current five times or larger the maximum base current of the transistor Q1.

To obtain high-precision approximation results for prominent nonlinear characteristics, i.e., to adjust the temperature characteristics of the output current supplied to the load 9 to exponential characteristics with a high precision, the current feedback common-emitter amplifier 5 having the current feedback resistor R3 according to the first embodiment is employed instead of a common-emitter amplifier having no current feedback resistor R3. When the transistor Q1 of the common-emitter amplifier 5 is a typical transistor, the value of the current feedback resistor R3 desirably falls within the range of 100 Ω to 5 kΩ.

In the common-emitter amplifier 5, an output current flows toward the collector of the transistor Q1. Since a voltage nonlinearly rising upon a temperature change must be generated at the current-to-voltage conversion resistor 3, a current discharge circuit for supplying a current from a high-voltage-side power supply Vcc (e.g., positive power supply) to the current-to-voltage conversion resistor 3 must be arranged. As the current discharge circuit, the first embodiment adopts a current mirror circuit 6.

The current mirror circuit 6 mirror-inverts a current output from the collector of the transistor Q1, and outputs the inverted current. The current mirror circuit 6 is constituted by transistors complementary to the transistor Q1, i.e., pnp transistors Q2 and Q3. The current mirror circuit 6 uses a resistor R6 in order to operate with good linearity.

A current output from the collector of the transistor Q1 in the common-emitter amplifier 5 is converted into a voltage by the transistor Q2 in the current mirror circuit 6. This voltage is converted again to a current by the transistor Q3. The current mirror circuit 6, which is simply constituted by the transistors Q2 and Q3 and the resistor R6 in the first embodiment, can operate with good linearity. A higher-performance current mirror circuit made up of a larger number of elements can also be employed.

When the collector current of the transistor Q1 is small and must be amplified, the transistors Q2 and Q3 forming the current mirror circuit 6 are made to have different sizes, i.e., different emitter areas such that an emitter area n of Q3 is larger than an emitter area m of Q2.

A mirror-inverted current output from the current mirror circuit 6 flows into the other terminal of the current-to-voltage conversion resistor 3, and is converted into a voltage. The voltage generated by the current-to-voltage conversion resistor 3 strongly depends on the temperature. A voltage as the sum of the temperature dependent voltage and the temperature independent stabilized voltage Vg from the stabilized voltage generating circuit 2 connected to one terminal of the current-to-voltage conversion resistor 3 is generated at the other terminal (current input terminal for the current mirror circuit 6) of the current-to-voltage conversion resistor 3.

The output impedance of the voltage generated at the current input terminal of the current-to-voltage conversion resistor 3 is as relatively high as the value RG of the resistor 3. In the case where the output-stage amplifier 8 has a higher impedance and can be directly driven, the voltage generated at the current input terminal of the current-to-voltage conversion resistor 3 is input to the output-stage amplifier 8. In the case where the impedance of the output-stage amplifier 8 is lower or output-stage amplifiers 8 are connected to constitute plural stages, however, the generated voltage is affected against variations in load 9, as a voltage source for driving the output-stage amplifier 8, and thus it is not preferable to be directly applied to the output-stage amplifier 8. In the first embodiment, therefore, the impedance of the voltage generated at the current input terminal of the current-to-voltage conversion resistor 3 is decreased by the buffer amplifier 7 having a gain of 1, and the resultant voltage is then input to the output-stage amplifier 8.

The output-stage amplifier 8 is a current feedback common-emitter amplifier made up of an npn output transistor Q4 and a current feedback resistor R4 connected to the emitter. The base of the output transistor Q4 receives an output from the buffer amplifier 7. Since an output current from the collector of the output transistor Q4 originally strongly depends on the temperature to obtain pseudo-exponential temperature characteristics, the current feedback resistor R4 need not have a large value. The resistance value is set to make the product of the resistance value and the current value flowing through the resistor R4 fall within the range of about 0.1 to 2.0 Ω·A. A current output from the collector of the output transistor Q4 is supplied to the load 9 such as an LD.

As described above, changing the voltage division ratio (values of the resistors R1 and R2) of the voltage divider 4 changes the temperature characteristics of the output current from the collector of the output transistor Q4, i.e., the characteristic temperature T0. When the voltage division ratio is fixed, the value RG of the current-to-voltage conversion resistor 3 is changed to increase only the characteristic temperature T0. That is, as a modification of the first embodiment, the value RG of the current-to-voltage conversion resistor 3 may be changed to change the characteristic temperature, or the voltage division ratio of the voltage divider 4 may be changed to change the characteristic temperature.

According to the temperature dependent constant-current generating circuit of the first embodiment, an output current which follows temperature variations in threshold current of the LD and changes with a high precision can be supplied as a DC bias current from the output-stage amplifier 8 to the LD as the load 9. Accordingly, pseudo zero bias driving of the LD, which is difficult to perform in a conventional circuit, can be realized.

[Second Embodiment]

Figure 2:
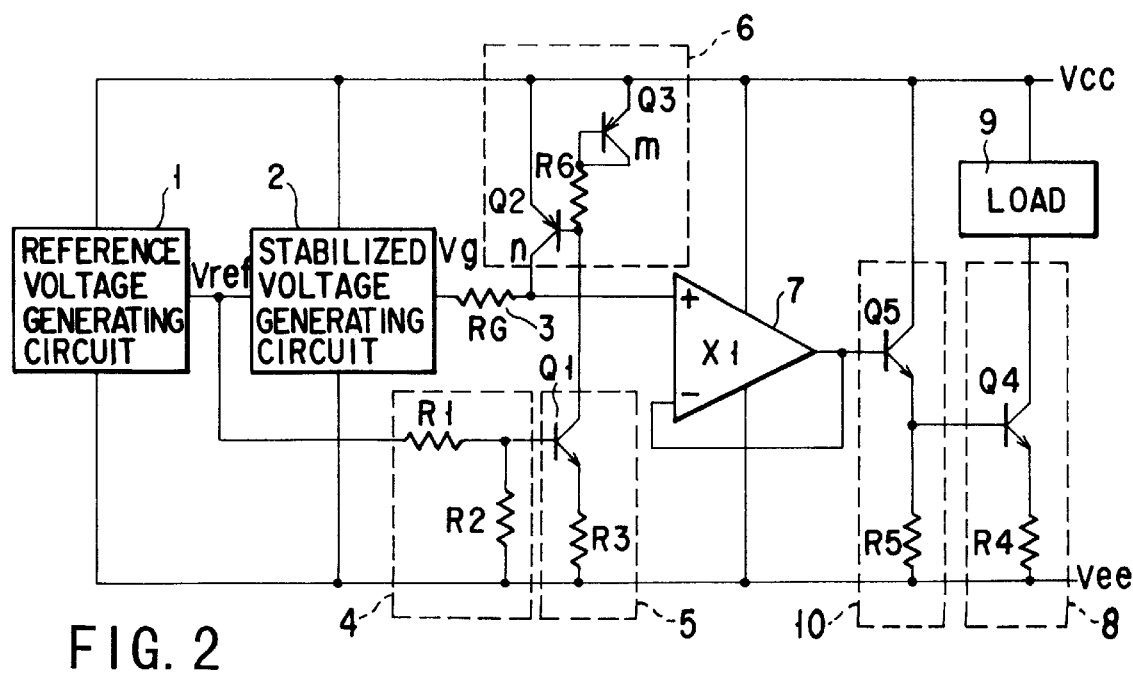
FIG. 2 is a circuit diagram showing a temperature dependent constant-current generating circuit according to the second embodiment of the present invention.

FIG. 2 shows a constant-current generating circuit according to the second embodiment of the present invention.

The constant-current generating circuit according to the first embodiment shown in FIG. 1 is suitable for a relatively small output current. To the contrary, the constant-current generating circuit according to the second embodiment shown in FIG. 2 can generate a larger output current, and comprises an emitter follower circuit 10 which is made up of a transistor Q5 and a resistor R5 connected to the emitter and inserted between a buffer amplifier 7 and an output-stage amplifier 8.

According to the second embodiment, the same good characteristics as those of the first embodiment can be realized. In addition, a larger current can be output by the current amplification function of the emitter follower circuit 10. With this arrangement, the stability can be kept high, compared to a case using, e.g., a Darlington output-stage amplifier in order to output a large current.

In this case, the newly added emitter follower circuit includes new temperature characteristics. For this reason, the optimal circuit constant determined in the first embodiment must be appropriately corrected in accordance with the arrangement of the second embodiment.

In the arrangement of the second embodiment, multi-stage output circuits can be arranged subsequent to the emitter follower circuit on the output stage of the buffer amplifier 7, thereby realizing an array output type constant-current generating circuit. In this case, the emitter follower circuit functions not only to amplify the current but also to ensure isolation between the channels of array outputs.

[Third Embodiment]

Figure 3:
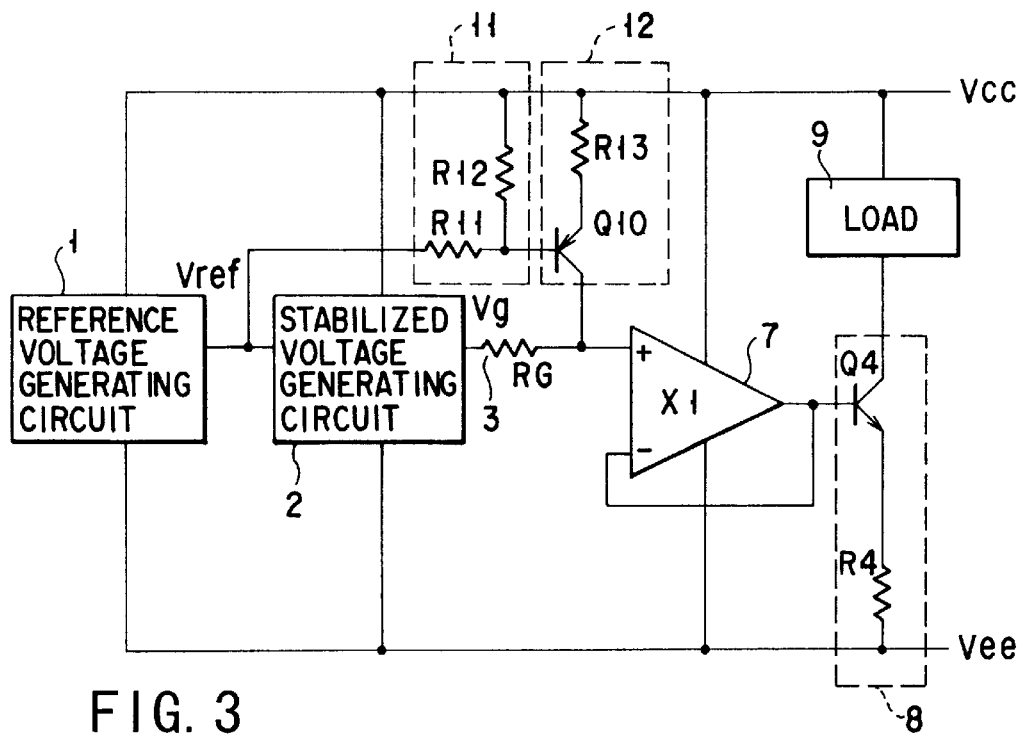
FIG. 3 is a circuit diagram showing a temperature dependent constant-current generating circuit according to the third embodiment of the present invention.

FIG. 3 shows a constant-current generating circuit according to the third embodiment of the present invention.

In the third embodiment, a current discharge common-emitter amplifier 12 made up of a pnp transistor Q1 and a resistor R13 connected to the emitter replaces the current mirror circuit 6 in the first and second embodiments. The reference voltage Vref from a reference voltage generating circuit 1 is divided by a voltage divider 11 made up of resistors R11 and R12. The divided voltage is applied to the base of the transistor Q10 to cause the current discharge common-emitter amplifier 12 to directly supply a current exponentially changing upon a temperature change to the current input terminal of a current-to-voltage conversion resistor 3. In other words, in the third embodiment, the common-emitter amplifier made up of the transistor Q1 and the resistor R2 in the first and second embodiments is basically reversed.

According to the third embodiment, the purposes of the present invention can be achieved by a smaller number of elements and a simpler arrangement than those in the first and second embodiments.

[Fourth Embodiment]

Figure 4:
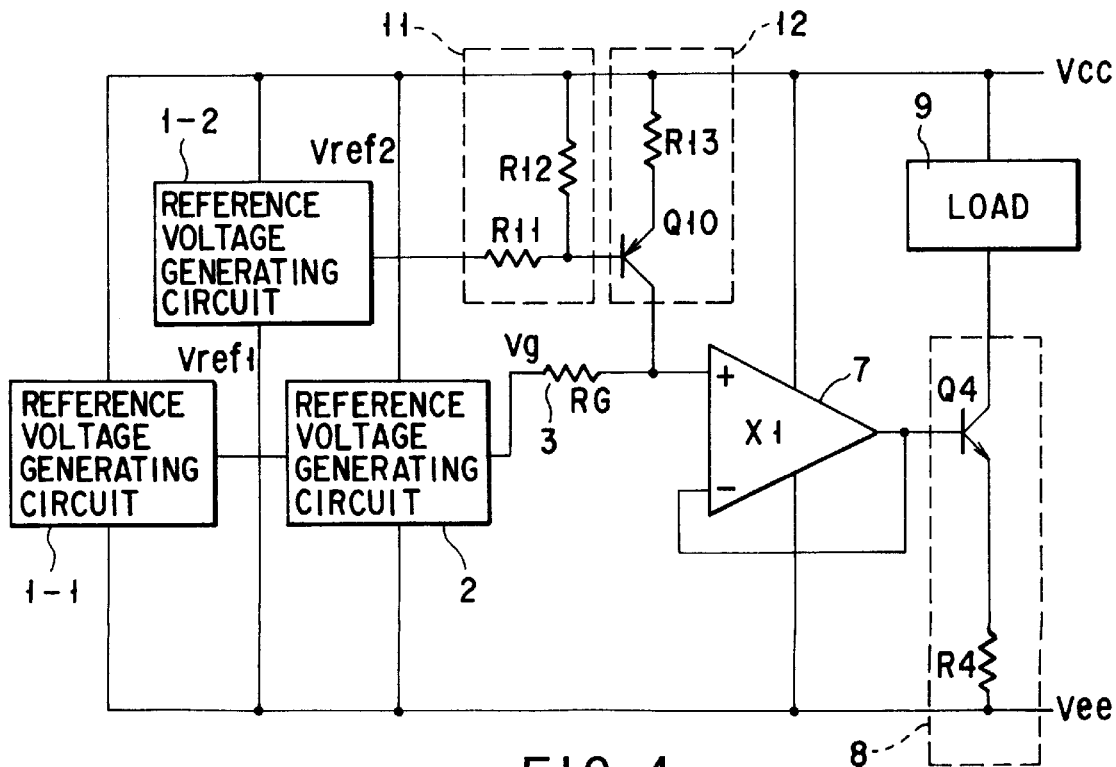
FIG. 4 is a circuit diagram showing a temperature dependent constant-current generating circuit according to the fourth embodiment of the present invention.

FIG. 4 shows a constant-current generating circuit according to the fourth embodiment of the present invention.

The fourth embodiment, which is an improvement of the third embodiment shown in FIG. 3, employs a first reference voltage generating circuit 1-1 for applying, to a stabilized voltage generating circuit 2, a reference voltage Vref1 using the potential of a low-voltage-side power supply Vee as a reference, and a second reference voltage generating circuit 1-2 for applying, to a voltage divider 11, a reference voltage Vref2 using the potential of a complementary high-voltage-side power supply Vcc as a reference.

In the third embodiment, the power supplies Vcc and Vee must be very stable. In the fourth embodiment, even if the power supplies Vcc and Vee vary, nearly the same characteristics as those in the first and second embodiments can be obtained.

[Fifth Embodiment]

Figure 5:
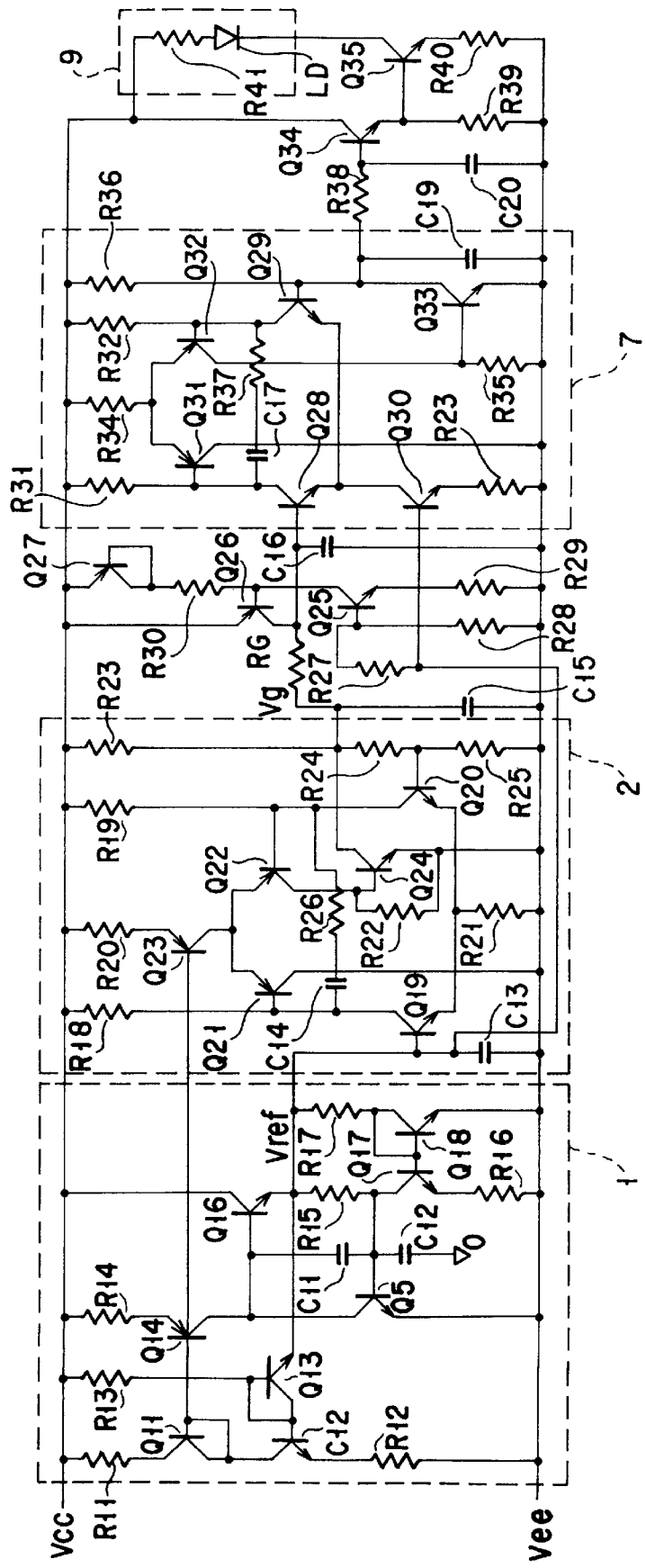
FIG. 5 is a circuit diagram showing a detailed example of a temperature dependent constant-current generating circuit according to the fifth embodiment of the present invention.

FIG. 5 is a circuit diagram of a detailed example of a constant-current generating circuit according to the fifth embodiment of the present invention.

A reference voltage generating circuit 1 is an improvement of the circuit proposed by the present inventors in Japanese Patent Application No. 9-73985 (Alternatively, the reference voltage generating circuit 1 may be an improvement of the circuit in U.S. patent application Ser. No. 08/828,778 (FIGS. 8A and 8B)).

More specifically, the reference voltage generating circuit 1 is constituted by a constant-current generating portion made up of transistors Q11 to Q14 and resistors R11 to R14, and a bandgap reference voltage generating portion which is driven by an output current from the current generating portion and made up of transistors Q15 to Q18, resistors R15 to R17, and capacitors C11 and C12. The reference voltage generating circuit 1 is characterized by adding the transistors Q12 and Q13 and the resistor R13 to the constant-current generating portion.

The transistors Q12 and Q13 have the same size. The transistor Q13 is diode-connected, its collector is connected to the high-voltage-side power supply Vcc via the resistor R13, and its emitter is connected to the output terminal of the reference voltage Vref. The resistance value of the resistor R13 is set at a value obtained by dividing, by the current value Ib flowing through the diode, a value prepared by subtracting the reference voltage Vref and the forward dropped voltage of the diode made up of the transistor Q13 from the voltage of the power supply Vcc. This resistance value can be set much larger than the differential resistance of the diode. The value of the resistor R12 is selected to satisfy Vref/Ib. While a voltage higher than the base voltage is applied to the collector of the transistor Q12, the voltage difference across the resistor R12 is kept at Vref regardless of the temperature and voltage variations in power supply Vcc.

More specifically, the pnp transistors Q11 and Q14 constituting the current mirror circuit of the constant-current generating portion have the same size. The resistors R11 and R14 respectively connected to the emitters of the transistors Q11 and Q14 have the same value. Then, a constant temperature-compensated current Ib is output from the transistor Q14 to the bandgap reference voltage generating sub-circuit. The element value of the bandgap reference voltage generating sub-circuit is adjusted to minimize the temperature dependency of Vref. With this setting, the stabilized reference voltage Vref against power supply voltage variations and temperature variations can be generated.

A stabilized voltage generating circuit 2 is constituted by a combination of two differential error amplifiers made up of transistors Q19 to Q23, resistors R18 to R22 and R24 to R26, and capacitors C13 and C14, and a common-emitter amplifier made up of a transistor Q24 and a load resistor R23. The stabilized voltage generating circuit 2 has a value Vg=(1+R14/R15)×Vref, and generates a stabilized voltage Vg having the same stability as that of Vref. The constant-current source transistor Q23 connected to the emitter common to a pair of differential transistors Q21 and Q22 of one of the two differential error amplifiers is constituted to flow the same current as that in the transistors Q11 and Q14 constituting a current mirror circuit in the reference voltage generating circuit 1. The output terminal of the stabilized voltage generating circuit 2 is connected to one terminal of a current-to-voltage conversion resistor RG corresponding to the resistor 3 in FIGS. 1 to 4, and to the low-potential-side power supply Vee via a capacitor. The reference voltage Vref from the reference voltage generating circuit 1 is divided by a voltage divider made up of resistors R27 and R28 corresponding to R1 and R2 in FIGS. 1 and 2. The divided voltage is input to a common-emitter amplifier made up of a transistor Q25 and a current feedback resistor R29 corresponding to Q1 and R3 in FIGS. 1 and 2. The other terminal of the current-to-voltage conversion resistor RG is connected to the current output terminal of a current mirror circuit made up of transistors Q26 and Q27 and a resistor R30 corresponding to Q2, Q3, and R6 in FIGS. 1 and 2, to the low-potential-side power supply Vee via a capacitor 16, and to a buffer amplifier 7 having a gain of 1.

Similar to the stabilized voltage generating circuit 2, the buffer amplifier 7 is constituted by two differential error amplifiers made up of transistors Q28 to Q32, resistors R31 to R35 and R37, and capacitors C17 and C18, and a common-emitter amplifier made up of a transistor Q33 and a load resistor R36. The constant-current source transistor Q30 connected to the emitter common to a pair of differential transistors Q28 and Q29 of one of the two differential error amplifiers is biased by the reference voltage Vref from the reference voltage generating circuit 1. The resistance value of the resistor R36 is set at a small value so as to always flow a current larger than the base current of the transistor Q34 of the emitter follower circuit. With this setting, the transistor Q33 is prevented from cutting off.

In the fifth embodiment, an output from the buffer amplifier 7 is input via an RF cutoff filter made up of the resistor R38 and a capacitor C20 to an emitter follower circuit made up of a transistor Q34 and a resistor R39 connected to the emitter that correspond to Q5 and R5 in FIG. 2. The RF cutoff filter is effective to suppress RF noise of an output current to the load 9 and to suppress RF crosstalk between channels for array outputs.

An output from the emitter follower circuit is input to an output-stage amplifier constituted by a current feedback common-emitter amplifier made up of an output transistor Q35 and a current feedback resistor R40 corresponding to Q4 and R4 in FIGS. 1 to 4. An output current is supplied from the collector of the output transistor Q35 to the load 9. Although the load 9 is constituted by a semiconductor laser diode LD and an additive terminal resistor R41 (overall composition of 50 Ω) directly connected to it, it is not limited to this arrangement and may be arbitrarily formed.

Figure 6:
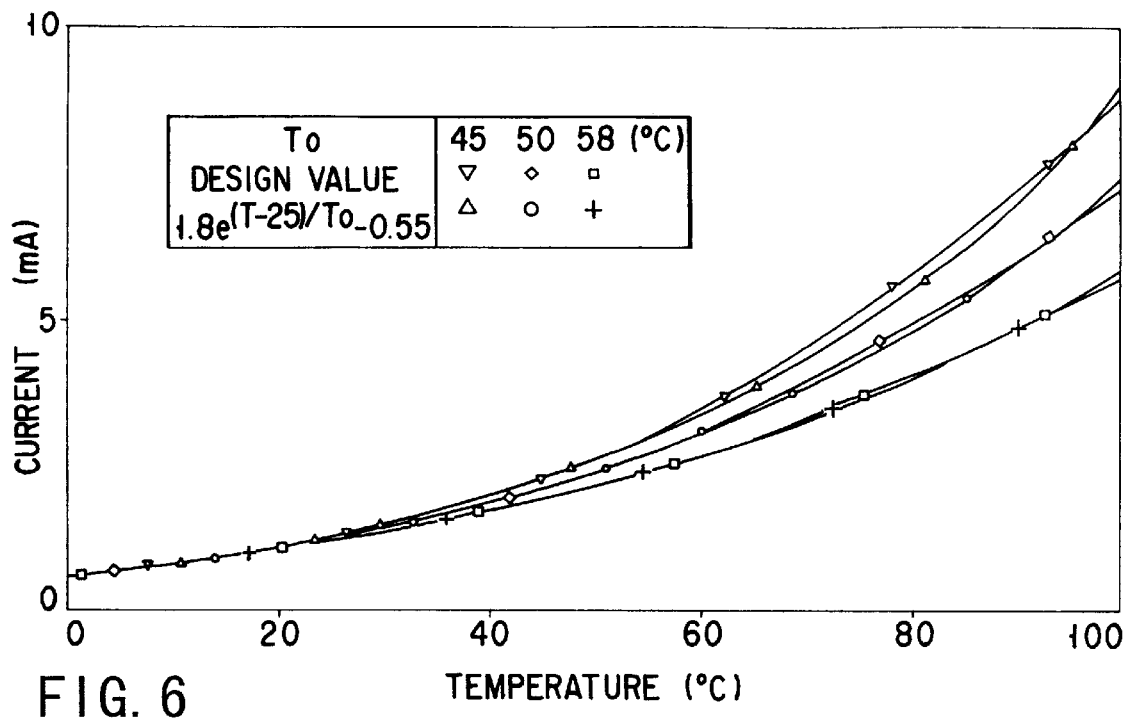
FIG. 6 is a graph showing the comparison between the simulation results of the temperature dependency of a DC bias current output in the temperature dependent constant-current generating circuit in FIG. 5, and the approximate exponential function.

FIG. 5 shows a design example using a silicon bipolar transistor, and FIG. 6 shows the comparison between the simulation results of the temperature dependency of a DC bias current output and the pseudo-exponential function. Three different resistance values RG of the current-to-voltage conversion resistor 3 are set for the characteristic temperature T0 varying within the range of 45° C. to 58° C. The simulation result coincides with the offset exponential function with ±0.2 mA or less within the temperature range of 100° C. The characteristics of an InP low-threshold laser actually oscillating at 1.31 μm, which were measured and plotted within the range of 0° C. to 80° C., substantially coincided with the curve (T0=50° C.) added with 0.6 mA.

If both of an LD and an IC chip are mounted on a high-thermal-conductivity carrier and set at the same temperature, and the constant-current generating circuit in FIG. 5 is used, a pseudo zero bias driving of the LD can be accurately realized. When the constant-current generating circuit was applied to a 12-channel array LD driving circuit which was given a characteristic temperature of several hundred ° C. by adjusting the parameters of the circuit, and had a pulse current output of several ten mA, the light output intensity was confirmed to allow temperature compensation.

In the above embodiments, the reference voltage generating circuit 1, 1-1, or 1-2 may be incorporated in an IC constituting the temperature dependent constant-current generating circuit of the present invention, or may be a reference voltage source outside the IC.

Embodiments of a driving circuit using the temperature dependent constant-current generating circuit will be described by exemplifying a semiconductor laser diode driving circuit in which the load is a semiconductor laser diode as a light emitting semiconductor element and is driven in accordance with a high frequency transmission signal.

[Sixth Embodiment]

Figure 7:
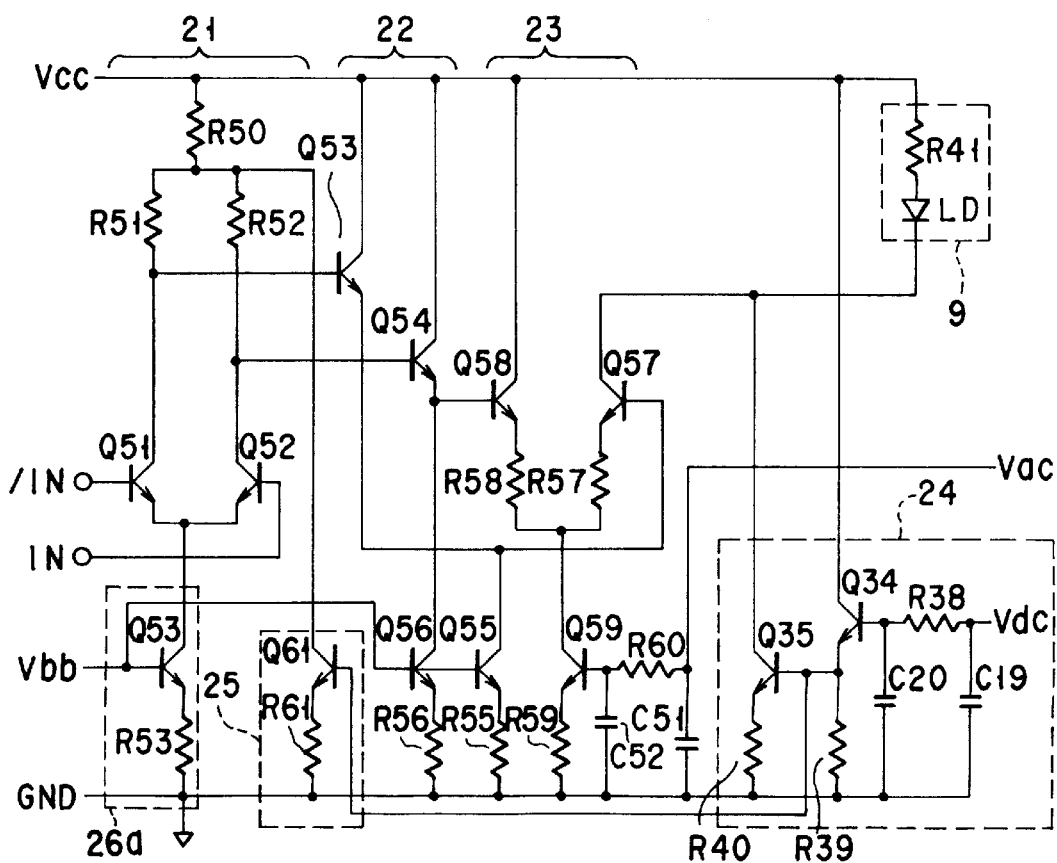
FIG. 7 is a circuit diagram showing a driving circuit according to the sixth embodiment of the present invention.

FIG. 7 shows a semiconductor laser driving circuit according to the sixth embodiment of the present invention. The semiconductor laser driving circuit is mainly constituted by a limit differential amplifier 21, a pair of intermediate amplifiers 22 constituted by emitter follower circuits, a current switching circuit 23, a temperature dependent constant-current generating circuit 24 described in the fifth embodiment, and a temperature dependent constant-current source 25. FIG. 7 shows part of the temperature dependent constant-current generating circuit 24 in FIG. 5.

The limit differential amplifier 21 amplifies a differential input signal input to differential input terminals IN and /IN to output a pulse voltage having a predetermined amplitude. The differential input terminals IN and /IN are respectively connected to the bases of a pair of differential transistors Q51 and Q52. The emitters of the transistors Q51 and Q52 are commonly connected. At the emitter common connection point, a constant-current source 26a made up of a transistor Q53 and a resistor R53 is connected. The base of the transistor Q53 is connected to a base bias source Vbb. The collector of each of the transistors Q51 and Q52 is connected to one terminal of corresponding one of load resistors R51 and R52. The other terminal of each of the load resistors R51 and R52 is connected to the positive power supply Vcc via a level shift resistor R50.

An output voltage from the collectors of the transistors Q51 and Q52 serving as the output terminal of the limit differential amplifier 21 is applied to the bases of transistors Q57 and Q58 of the current switching circuit 23 via the intermediate amplifiers 22 constituted by emitter follower circuits made up of the transistor Q53, a transistor Q54, transistors Q55 and Q56 which serve as the emitter loads of the transistors Q53 and Q54, and a current source formed of resistors R55 and R56. The collector of the transistor Q57 is connected to the power supply Vcc via a load 9, whereas the collector of the transistor Q58 is directly connected to the power supply Vcc.

The emitter of each of the transistors Q57 and Q58 is connected to one terminal of corresponding one of current feedback resistors R57 and R58 for suppressing ringing of an output pulse current from the collector. Since the current feedback resistors R57 and R58 are arranged to suppress ringing, their resistance values suffice to be very small. The other terminal of each of the current feedback resistors R57 and R58 is commonly connected. At the common connection point, a constant-current source made up of a transistor Q59 and a resistor R59 is connected. A control voltage for controlling the amplitude of an output pulse current from a control voltage source Vac is applied to the base of the transistor Q59.

The collector of the transistor Q34 constituting the emitter follower circuit of the temperature dependent constant-current generating circuit 24 is connected to the power supply Vcc of the load 9. The collector of the transistor Q35 constituting an output-stage amplifier is connected to the side opposite to the power supply Vcc of the load 9. Reference symbol Vdc in FIG. 7 denotes an output voltage from the buffer amplifier 7 in FIG. 5, which depends on the temperature, as described above. The output voltage Vdc is applied to the base of the transistor Q34.

In the sixth embodiment, the temperature dependent constant-current source 25 is connected to the connection point between the level shift resistor R50 and the load resistors R51 and R52 in the limit differential amplifier 21. The temperature dependent constant-current source 25 is made up of a transistor Q61 and a resistor R61. The base of the transistor Q61 is connected to the emitter of the transistor Q34 in the temperature dependent constant-current generating circuit 24. A temperature dependent constant current flowing through the transistor Q34 also flows through the transistor Q61 connected to the emitter of the transistor Q34.

The operation of the driving circuit according to the sixth embodiment will be explained.

At the emitter common connection point between the transistors Q51 and Q52 in the limit differential amplifier 21, a temperature independent constant current (I1) flows from a constant-current source 26a made up of the transistor Q53 whose base receives a predetermined base bias voltage Vbb, and the resistor R53. In this case, the same constant current I1 flows through the level shift resistor R50 regardless of an input to the limit differential amplifier 21, causing a predetermined level shift (voltage drop: I1·R50). Then, the potential at the connection point between the resistors R50, R51, and R52 decreases from the voltage of the power supply Vcc to a potential (Vcc−I1·R50) by the voltage drop (I1·R50).

A pulse voltage input to the bases of the transistors Q57 and Q58 of the current switching circuit 23 on the final stage via the intermediate amplifiers 22 constituted by the emitter follower circuits generates a negative pulse voltage in a ground direction from a high voltage (Vcc−I1·R50−Vbe) obtained by subtracting the voltage drop (I1·R50) at the level shift resistor R50 and the voltage Vbe between the base and emitter of the transistors Q53 and Q54 from Vcc.

A current flowing into the current switching circuit 23 from a current source made up of the transistor Q59 connected to the emitters of the transistors Q57 and Q58 via the current feedback resistors R57 and R58, and the resistor R59 is switched in accordance with the pulse voltage depending on the magnitudes of the base voltages of the transistors Q57 and Q58. The obtained current is output as a pulse current from the collector of the transistor Q58 to the load 9. When the pulse current is output to the load 9, the base voltage of the transistor Q57 is at a high level. In this case, the transistor Q57 has an emitter voltage obtained by subtracting, from Vcc, the voltage drop at the level shift resistor R50 and the voltage Vbe between the base and emitter of the transistors Q53 and Q54, i.e., the forward voltages of two equivalent diodes. When the temperature rises, the emitter potential of the transistor Q57 also rises with the temperature coefficients of two equivalent diodes.

In the sixth embodiment, the temperature dependent constant-current generating circuit 24 can supply a constant current having a positive temperature coefficient to the load 9. At the same time, the temperature dependent constant-current source 25 can adjust the current I1 having a positive temperature coefficient which flows through the level shift resistor R50. If the current from the temperature dependent constant-current source 25 is appropriately adjusted using, e.g., the resistor R62, a voltage having a positive temperature coefficient enough to cancel the temperature coefficients of a half of two equivalent diodes can be generated at the level shift resistor R50.

Consequently, the voltage at the emitter common connection point (connection point between the current feedback resistors R57 and R58) between the transistors Q57 and Q58 of the current switching circuit 23 can be kept constant regardless of the operation temperature. Even if the transistor Q57 ensures at least the voltage between the collector and emitter necessary for a high-speed operation, the application voltage to the load 9 remains unchanged.

In a conventional semiconductor laser driving circuit, large margins are distributed to internal circuits in consideration of various external variations. In the driving circuit of the sixth embodiment, the voltage bias point at the emitter of the transistor Q57 is kept constant regardless of the temperature. Accordingly, the bias point can be set as low as possible in consideration of only voltage variations in power supply Vcc.

In this manner, all extra margins can be transferred to the load 9. Compared to the conventional design, the margin of the load increases by 0.3 V or more within the operation temperature range of 0° C. to 100° C. even in a driving circuit using a 3.3-V low-voltage power supply as the power supply Vcc. The margin of the load increases about 20%, which is significant because no margin is set in the conventional design.

[Seventh Embodiment]

Figure 8:
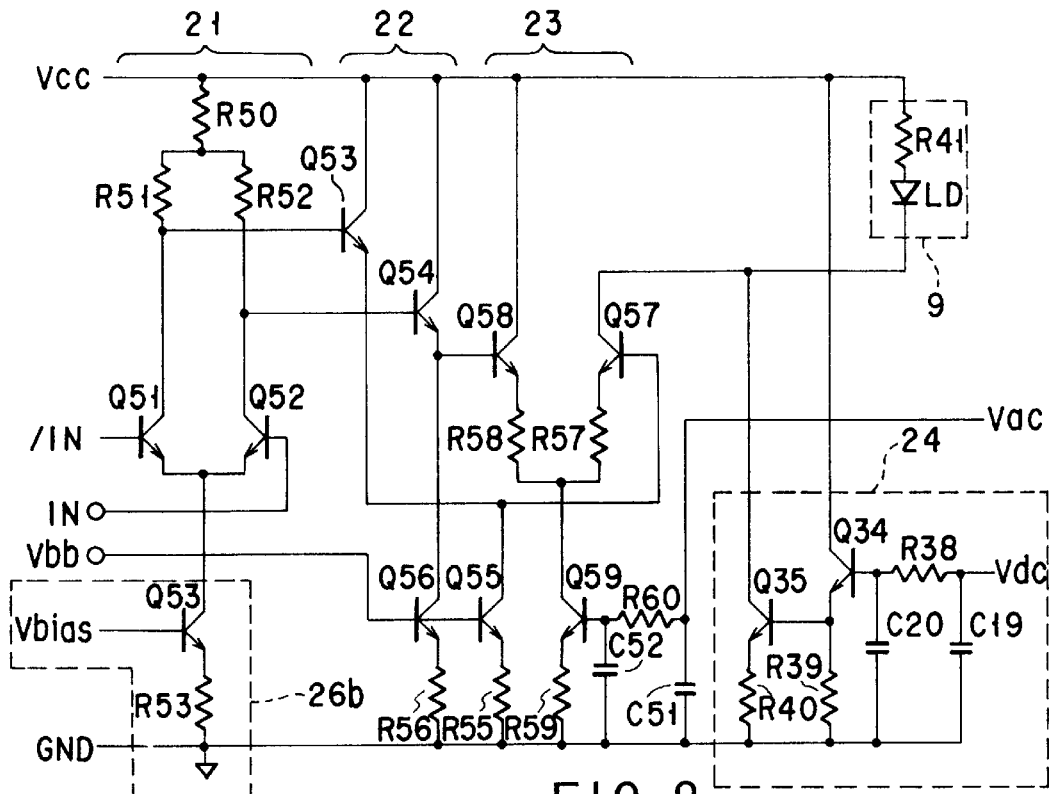
FIG. 8 is a circuit diagram showing a driving circuit according to the seventh embodiment of the present invention.

FIG. 8 shows a semiconductor laser driving circuit according to the seventh embodiment of the present invention. The same reference numerals as in FIG. 7 denote the same parts. In the seventh embodiment, a temperature dependent constant-current source 26b made up of a transistor Q53 connected to the emitter common connection point between transistors Q51 and Q52, and a resistor R53 replaces the temperature dependent constant-current source 25 connected to the connection point between the level shift resistor R50 and the load resistors R51 and R52 in the limit differential amplifier 21 in FIG. 7.

More specifically, in the temperature dependent constant-current source 26b, a VC bias voltage Vbias from a voltage source having the same temperature dependency as that of Vdc is applied to the base of the transistor Q53. This gives a positive temperature coefficient to a current flowing into a level shift resistor R50. A voltage drop at the level shift resistor R50 cancels the temperature coefficients of a half of two equivalent diodes. In this method, however, the amplitude of a pulse voltage for driving transistors Q57 and Q58 of a current switching circuit 23 also increases with the same temperature coefficient. For this reason, the margin is about half the margin in the sixth embodiment shown in FIG. 7.

[Eighth Embodiment]

Figure 9:
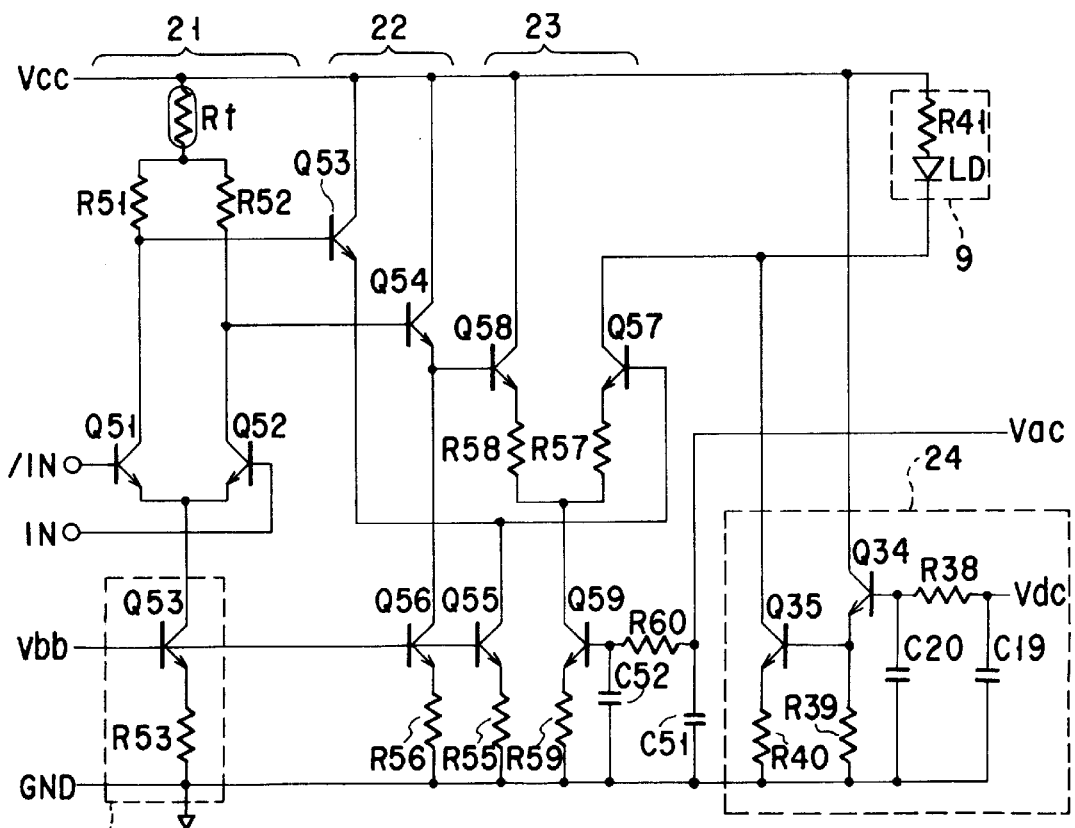
FIG. 9 is a circuit diagram showing a driving circuit according to the eighth embodiment of the present invention.

FIG. 9 shows a semiconductor laser driving circuit according to the eighth embodiment of the present invention. The same reference numerals as in FIG. 7 denote the same parts. In the eighth embodiment, the temperature dependent constant-current source 25 connected to the connection point between the level shift resistor R50 and the load resistors R51 and R52 is omitted from the limit differential amplifier 21 in FIG. 7. In addition, a temperature-sensitive resistive element having a positive temperature coefficient, i.e., a thermistor Rt having positive characteristics replaces the level shift resistor R50 formed of a fixed resistor. In this case, a temperature independent constant-current source 26c made up of a transistor Q53 and a resistor R53 is used. When the thermistor Rt cannot be realized by a normal IC manufacturing process, it is externally connected to the IC.

According to the eighth embodiment, a voltage drop change occurs at the thermistor Rt, i.e., the same temperature coefficient of a voltage drop as a half of two equivalent diodes occurs by a voltage determined by the product of the resistance value of the thermistor Rt and the current I1 flowing through the thermistor Rt. Therefore, the temperature coefficients of a half of two equivalent diodes can be canceled. The same effects as those in the sixth and seventh embodiments can be obtained.

In the above description, the high-voltage-side power supply Vcc is a positive power supply, and the low-voltage-side power supply Vee is a ground potential. Instead, Vcc may be a ground potential, and Vee may be a negative power supply.

The present invention can also be applied to a circuit in which all npn and pnp transistors are exchanged to reverse all current directions. Although the above embodiments have exemplified the silicon bipolar transistor, the transistor may be a GaAs- or InP-based HBT. As far as the basic circuit operation is the same, the present invention can also be applied to even another type of transistor such as a MOSFET, CMOSFET, GaAs MESFET, or HEMT except for a transistor used to obtain an output current exponentially changing with respect to an input voltage. When an FET is used in place of the bipolar transistor, the gate, drain, and source of the FET respectively replace the base, collector, and emitter of the bipolar transistor.

The above embodiments have described the semiconductor laser driving circuit, but the driving circuit of the present invention can be generally applied to direct modulation of a light emitting semiconductor element such as a semiconductor laser diode or a light-emitting diode. For example, the driving circuit of the present invention can be widely applied to a high-speed pulse current output circuit of an open collector or drain type, such as an output circuit for a pulse generator which outputs a pulse current and terminates at a resistor.

As has been described above, the present invention can realize a temperature dependent constant-current generating circuit which can generate, with a high precision, a DC bias current that faithfully follows temperature variations in threshold current and is slightly smaller than the threshold current in order to enable pseudo zero bias driving of the LD, and can independently adjust a temperature variation portion having large nonlinearity and a temperature independent portion.

The temperature dependent constant-current generating circuit of the present invention can be applied to a constant-current generating circuit for compensating the temperature dependency of the light emission intensity of an LD having a high characteristic temperature by changing the circuit constant.

The present invention can realize a circuit arrangement and function applicable to the array output, and a chip size small enough to incorporate in one chip IC including the laser driving circuit.

In the light emitting semiconductor element driving circuit according to the present invention, the load operation margin can be increased for the same power supply voltage by slightly improving a conventional driving circuit. If all margins distributed to internal circuits in consideration of various external factors are transferred to the load, the driving circuit can stably operate even with a low-voltage power supply. Therefore, the power supply voltage can be decreased.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. A temperature dependent constant-current generating circuit
   a stabilized voltage generating circuit configured to generate a stabilized voltage using a predetermined reference voltage;
   a voltage divider configured to divide the reference voltage;
   a current amplifier including a transistor having a base or gate connected to a divided-voltage output terminal of said voltage divider and a grounded emitter or source;
   a current mirror circuit configured to output a mirror-inverted current of the current output from said current amplifier;
   a current-to-voltage conversion resistor having one terminal connected to an output terminal of said stabilized voltage generating circuit and the other terminal connected to an output terminal of said current mirror circuit; and
   an output-stage amplifier including a transistor having a base or gate for receiving a voltage generated at the other terminal of said current-to-voltage conversion resistor, and a current feedback resistor connected to an emitter or source of the transistor, the transistor having a collector or drain connected to a load.

2. A circuit according to claim 1, further comprising a buffer amplifier inserted between the other terminal of said current-to-voltage conversion resistor and the base or gate in said output-stage amplifier.

3. A circuit according to claim 1, wherein at least one of a resistance value of said current-to-voltage conversion resistor and a voltage division ratio of said voltage divider is variable.

4. A temperature dependent constant-current generating circuit comprising:
   a stabilized voltage generating circuit configured to generate a stabilized voltage using a predetermined reference voltage;
   a voltage divider configured to divide the reference voltage;
   a current amplifier including a transistor having a base or gate connected to a divided-voltage output terminal of said voltage divider and a grounded emitter or source;
   a current-to-voltage conversion resistor having one terminal connected to an output terminal of said stabilized voltage generating circuit and the other terminal connected to an output terminal of said current amplifier;
   an output-stage amplifier including a transistor having a base or gate for receiving a voltage generated at the other terminal of said current-to-voltage conversion resistor, and a current feedback resistor connected to an emitter or source of the transistor, the transistor having a collector or drain connected to a load; and
   a buffer amplifier inserted between the other terminal of said current-to-voltage conversion resistor and the base or gate in said output-stage.

5. A circuit according to claim 4, wherein at least one of a resistance value of said current-to-voltage conversion resistor and a voltage division ratio of said voltage divider is variable.

6. A circuit according to claim 2, further comprising an amplifier including a transistor having a base or gate which is connected to an output terminal of said buffer amplifier and an emitter or source which is connected to the base or gate of the transistor of said output-stage amplifier.

7. A circuit according to claim 4, further comprising an amplifier including a transistor having a base or gate which is connected to an output terminal of said buffer amplifier and an emitter or source which is connected to the base or gate of the transistor of said output-stage amplifier.

* * * * *